United States Patent [19]

Dayton

[11] Patent Number: 5,095,282

[45] Date of Patent: Mar. 10, 1992

[54] DIFFERENTIAL AMPLIFIER APPARATUS

[75] Inventor: Birney D. Dayton, Nevada City, Calif.

[73] Assignee: NVision, Inc., Nevada City, Calif.

[21] Appl. No.: 572,478

[22] Filed: Aug. 23, 1990

[51] Int. Cl.⁵ ............................................. H03F 3/45
[52] U.S. Cl. ....................................... 330/69; 330/258
[58] Field of Search ................................... 330/69, 258

[56] References Cited

U.S. PATENT DOCUMENTS 4,206,416  6/1980  Kellogg ................................. 330/69
4,879,521  11/1989  Bredemann et al. ............. 330/69 X Primary Examiner—James B. Mullins
Attorney, Agent, or Firm—Dellett, Smith-Hill and Bedell

[57] ABSTRACT

Differential amplifier apparatus comprises a summing and inverting network for developing an output signal of which the magnitude is proportional to the common mode component of an input signal received at first and second input terminals of the apparatus and of which the polarity is opposite the polarity of the common mode component. A summing network is connected to the first and second input terminals and to the output of the summing and inverting network and has first and second intermediate nodes. A first differential amplifier has a non-inverting input connected to a first intermediate node of the summing network, and a second differential amplifier has a non-inverting input connected to the second intermediate node of the summing network. A bridging resistor is connected between the inverting inputs of the first and second differential amplifiers.

25 Claims, 2 Drawing Sheets

DIFFERENTIAL AMPLIFIER APPARATUS

BACKGROUND OF THE INVENTION

This invention relates to differential amplifier apparatus.

An audio signal Va may be applied to a utilization device, such as a transducer, a processing device, such as a mixer, or a distribution device, such as a switch, in single-ended form, in which the useful signal information is represented by the voltage between a single conductor and a reference potential level, such as ground. However, it is common to distribute an audio signal associated with a video signal through a television production facility by use of two conductors on which a differential audio signal ± Vd is impressed at the source of the audio signal. The differential mode of signal transmission is employed because it has better noise immunity than single-ended transmission. Ambient fields and other effects induce a common mode signal component on the two conductors, so that the signal that is detected at the receiving end is a voltage Vc + Vd on one conductor and a voltage Vc − Vd on the other conductor, where Vc is the common mode signal component.

The differential signal is applied to the utilization device or other load through an interface circuit that converts the differential signal to a single-ended signal. The interface circuit must remove the common mode signal component from the signal received by the interface circuit without impairing the differential mode signal component.

It is known to use a transformer to convert a differential signal to a single-ended signal. The transformer's primary winding is connected between the two conductors, and one end of the transformer's secondary winding is connected to the inverting input of an operational amplifier. Use of a transformer has the disadvantage that its performance at low audio frequencies is poor.

Another form of interface circuit comprises an operational amplifier and an inverter that feeds the output signal of the operational amplifier to its non-inverting input. This type of interface circuit has the disadvantage that the feedback has the effect of lowering the differential mode input impedance of the operational amplifier, and in order to restore the impedance to a desirably high value it is necessary to increase resistor values, which has the effect of increasing resistance noise.

Bredemann et al, U.S. Pat. No. 4,879,521 issued Nov. 7, 1989, discloses a differential amplifier in which the common mode component of the input signal is detected and inverted and is then summed with the input signal, canceling the common mode component of the input signal.

SUMMARY OF THE INVENTION

In accordance with a first aspect of the present invention, there is provided differential amplifier apparatus for receiving a differential input signal at first and second input terminals, said differential amplifier apparatus comprising summing and inverting means for developing at an output thereof a signal of which the magnitude is proportional to a common mode component of the input signal and of which the polarity is opposite the polarity of the common mode component, a summing network connected to the first and second input terminals and to the output of the summing and inverting means and having first and second intermediate nodes, a first differential amplifier having a non-inverting input connected to the first intermediate node of the summing network and also having an inverting input and an output, a second differential amplifier having a non-inverting input connected to the second intermediate node of the summing network and also having an inverting input and an output, and a bridging resistor connected between the inverting inputs of the first and second differential amplifiers.

In accordance with a second aspect of the invention there is provided differential amplifier apparatus for receiving a differential input signal applied by a cable having first and second core conductors and a shield, said apparatus comprising inverter means having an input terminal and an output terminal, a resistor connected between the shield of the cable and the input terminal of the inverter, a summing network connected to the first and second core conductors and to the output of the inverter means and having first and second intermediate nodes, a first amplifier having an input connected to the first intermediate node of the summing network and also having an output, and a second amplifier having an input connected to the second intermediate node of the summing network and also having an output.

BRIEF DESCRIPTION OF THE DRAWING

For a better understanding of the invention, and to show how the same may be carried into effect, reference is now being made, by way of example, to the accompanying drawing in which.

DETAILED DESCRIPTION

Figure 1:
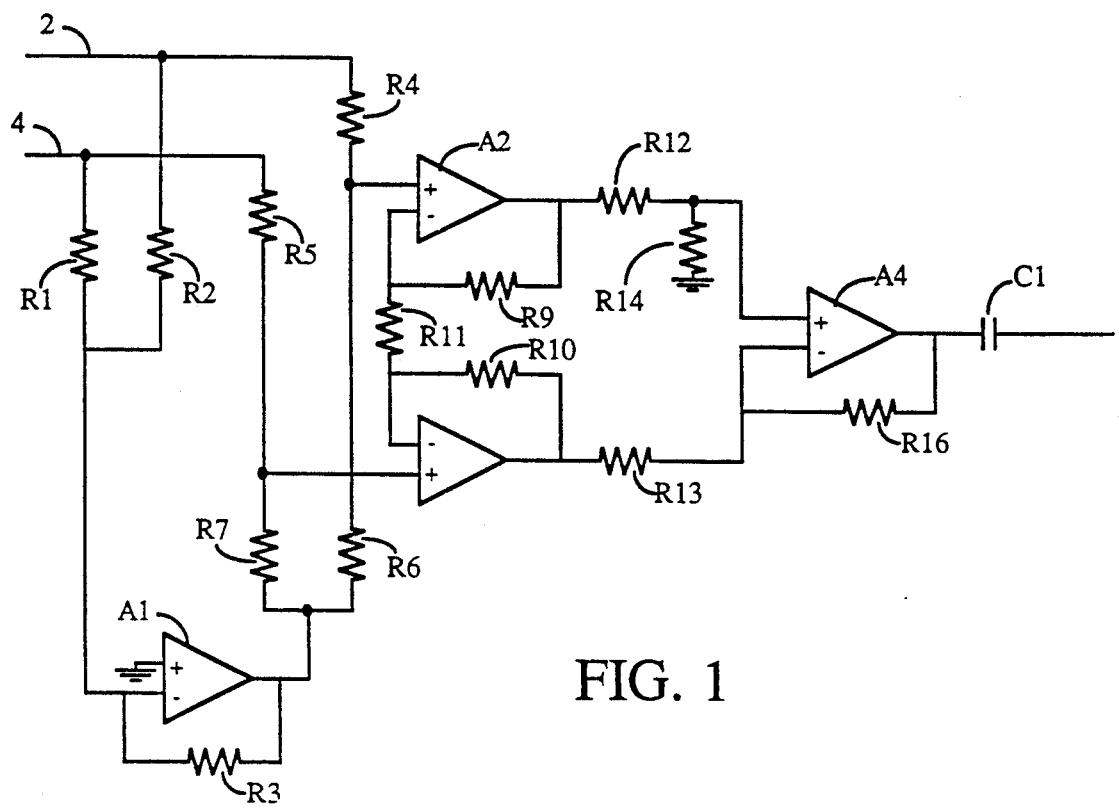
FIG. 1 is a block diagram of differential amplifier circuit embodying the present invention.

In the amplifier circuit shown in FIG. 1, two conductors 2, 4 carrying a differential audio signal Vc + Vd and Vc − Vd are connected to opposite ends of a resistive divider composed of resistors R1, R2 and having a center node connected to the inverting input of an operational amplifier A1. Amplifier A1 is provided with a feedback resistor R3. Conductors 2 and 4 are also connected to opposite ends of a summing network composed of resistors R4–R7. The node intermediate resistors R4 and R6 is connected to the non-inverting input of an operational amplifier A2 and the node intermediate resistors R5 and R7 is connected to the non-inverting input of an operational amplifier A3. The node that is between resistors R6 and R7 is connected to the output of amplifier A1. Amplifiers A2 and A3 have feedback resistors R9 and R10, and their inverting inputs are bridged by a resistor R11. The output terminals of amplifiers A2 and A3 are connected to the non-inverting and inverting inputs of an operational amplifier A4, which has a feedback resistor R16, through resistors R12 and R13 respectively. The non-inverting input of amplifier A4 is connected to ground through a resistor R14, and receives feedback provided by an operational amplifier A5, resistors R15 and R17 and a capacitor C1.

The resistor values are chosen to satisfy the following relationships:

R1=R2

$$R4 = R5$$

$$R6 = R7$$

$$R9 = R10$$

$$R12 = R13$$

$$(R1//R2)/R3 = R4/R6 = R5/R7$$

$$(R14//R15) = R16$$

where (Ri//Rj) represents the resistance value of resistor Ri in parallel with resistor Rj.

It can be shown that a differential signal exists between the non-inverting inputs of amplifiers A2 and A3 and that this differential signal is related to that which exists between conductors 2 and 4 by an attenuation factor equal to $$(R4+R6)/R6$$

Therefore, the differential signal existing at the non-inverting inputs of amplifiers A2 and A3 is equal to $$Vd*R6/(R4+R6)$$

Amplifier A1 provides an output signal equal to $$-Vc*R3/(R1//R2)$$

It can also be shown that the output signal of amplifier A1 applied to the node between resistors R6 and R7 cancels the common mode signal component at terminals 2, 4, resulting in a zero common mode signal component at the non-inverting inputs of amplifiers A2 and A3.

The gain of the first amplification stage, comprising amplifiers A2 and A3, is given by $$1+(R9+R10)/R11$$

and the gain of the second amplification stage, comprising amplifier A4, is R16/R13. Thus, by changing the value of R11, the overall gain of the amplifier circuit can be changed.

The common mode rejection ratio (CMRR) of the first amplification stage is determined by the balance of R4, R6; R5, R7; and R9, R10: the more perfectly each pair of resistors is balanced, the higher is the CMRR. The CMRR of the amplifier circuit is independent of R11, and therefore changing the value of resistor R11 does not affect the common mode rejection of the amplifier circuit.

The circuit illustrated in FIG. 1 is able to accommodate a common mode signal whose range is equal to the input attenuation factor (R4 +R6)/R6 multiplied by the maximum voltage swing of the output amplifier A1 plus the common mode rang of operational amplifiers A2 and A3. For example, with R5 equal to R7, providing an attenuation factor of two, and a ± 13-volt output swing of amplifier A1, a common mode range of 55 volts can be achieved.

The differential mode input impedance is equal to (R1+R2)//(R4+R5+R6+R7). Consequently, by making R1 and R2 large, a high differential mode input impedance can be achieved, but resistance noise generated in resistors R1, R2 and R3, being in the common mode path, is attenuated out by the common mode rejection of the second amplification stage. Similarly, any noise generated in amplifier A1 is attenuated out.

The common mode input impedance of the amplifier circuit shown in FIG. 1 is equal to R1//R2//R4//R5.

Figure 2:
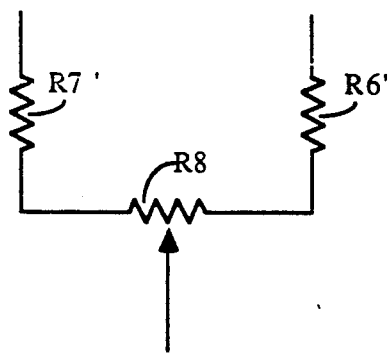
FIG. 2 illustrates a modification of a part of the FIG. 1 circuit.

The second stage of the amplifier circuit shown in FIG. 1 is depicted as a simple differential amplifier A4 which receives negative feedback through resistor R16. The output of amplifier A4 is connected to a load (not shown) through an AC coupling capacitor C1, which removes DC offset voltage present at the output of amplifier A4. For large DC offsets, due to a DC component in the differential mode signal, an AC coupling capacitor may be provided in series with resistor R11. It will be appreciated that it can be quite difficult to achieve a very good balance of resistors R4, R5 and R6, R7. In order to accommodate mismatch, resistors R6 and R7 may be replaced by resistors R6' and R7' and a potentiometer R8, as shown in FIG. 2, with R6'+R8/2 equal to R6.

Figure 3:
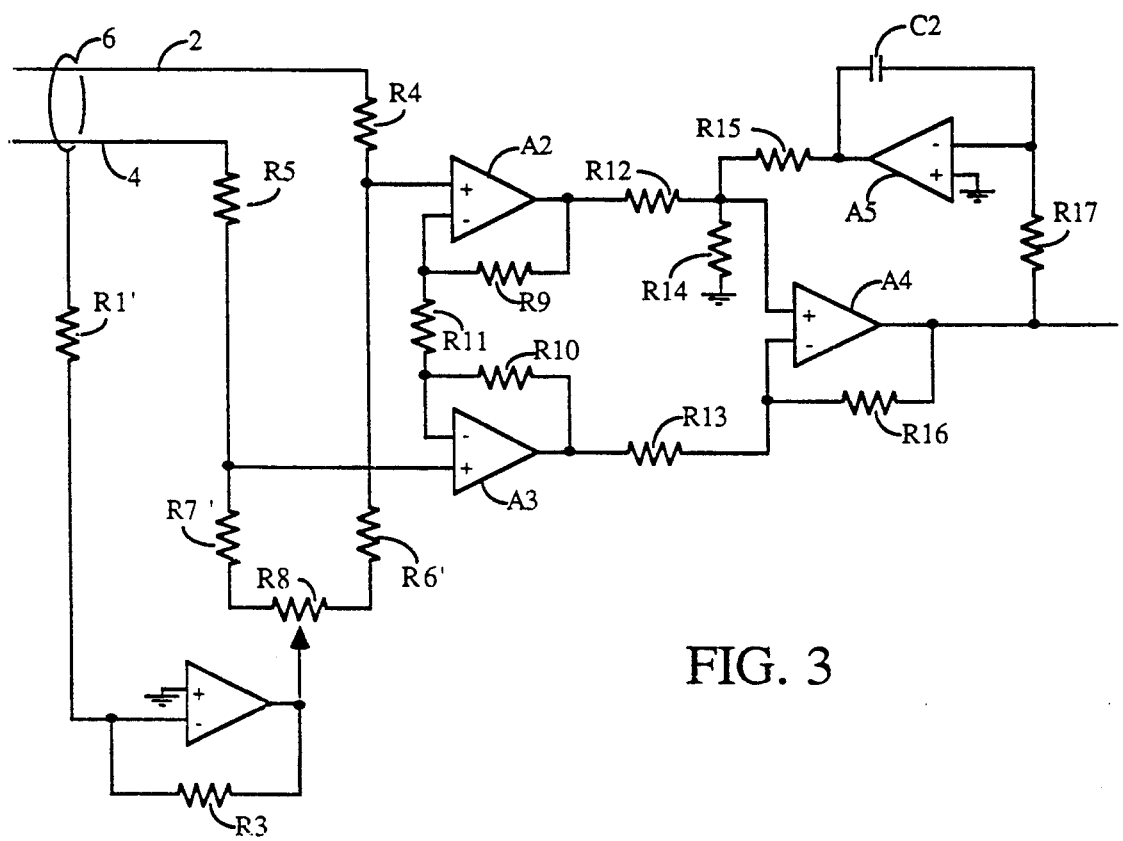
FIG. 3 is a block diagram of a modified form of the FIG. 1 amplifier circuit.

The conductors 2 and 4 shown in FIG. 1 would generally be the two core conductors of shielded twinaxial cable, i.e., a cable having two core conductors and a shield. In the audio distribution system of a television production facility, the shield of the twinaxial cable is usually grounded at the sending end of the cable and is floating at the receiving end. Since the shield is floating, a common mode signal is developed in the shield. In the modification shown in FIG. 3, the common mode signal that is inverted and fed forward to cancel the common mode component on conductors 2 and 4 is taken from shield 6. In the case of FIG. 3, R1'/R3 is equal to R4/(R6'+R8/2).

Capacitor C1 in FIG. 1 is quite large if the load impedance is low. The need for a large AC coupling capacitor is avoided in the case of the amplifier circuit shown in FIG. 3 by use of integrating amplifier A5 and associated components, including capacitor C2, which act as a virtual AC coupling capacitor for removing any DC component from the signal at the output of amplifier A4. Resistor R12 of FIG. 3 may also be large, and therefore capacitor C2 of FIG. 3 can be much smaller than capacitor C1 of FIG. 1. Also, the attenuation provided by resistor R15, which is typically ten times resistor R14, lengthens the effective time constant of the combination of resistor R17 and capacitor C2 and allows capacitor C2 to be even smaller. The CMRR of the second stage of the FIG. 3 circuit is determined by the balance of R12, R13; R16, R14//R15.

If conventional AC coupling capacitors were employed between conductors 2, 4 and amplifiers A2 and A3, any difference between the capacitors would affect the CMRR of the circuit, and the capacitors would introduce phase shifts in the common mode signal component. Since capacitor C2 is not in the path of the common mode signal component, it does not affect the common mode rejection ratio of the amplifier circuit.

The time constant of the network including operational amplifier A5 is given by $$C1*R17(R12//R14)(1+R16/R13)/(R15+R12//R14)$$

The circuit shown in FIG. 3 exhibits transformer-like input behavior without having its performance impaired at low audio frequencies.

Typical component values for the circuit shown in FIG. 3 are:

R1' and R3 - 30 kohm

R4, R5, R6' and R7' - 10 kohm
R8 - 100 ohm
R9, R10 and R16 - 2.0 kohm
R11 - 4019 ohm, 1342 ohm, 576 ohm, selectively connectable by jumpers
R12 and R13 - 4371 ohm
R14 - 2.2 kohm
R15 - 22 kohm
R17 - 47 kohm
C2 - 0.1 F It will be appreciated that the invention is not restricted to the particular embodiments that have been described, and that variations may be made therein without departing from the scope of the invention as defined in the appended claims and equivalents thereof. For example, although the arrangement in which the values of R1-R7 are selected so that amplifier A1 operates as a unity gain inverter and the common mode signal component at terminals 2, 4 is fully canceled from the signal existing at the input terminals of amplifiers A2, A3 is attractive, it is subject to disadvantage in the case where the output signal of amplifier A1 might extend outside the linear range of amplifier A1. In that case, the common mode input impedance is not uniform throughout the operating range of the circuit. This disadvantage can mitigated by changing the relative values of R3 and (R1//R2) so that the gain of amplifier A1 is substantially less than unity, so that the common mode signal component at terminals 2, 4 is not completely eliminated from the signal existing at the noninverting inputs of amplifiers A2 and A3, and the common mode component at the outputs of amplifiers A2, A3 is removed by the second amplification stage. In this modification, which is applicable also to the circuit shown in FIG. 3, the range of input common mode signal amplitude for which amplifier A1 has a linear response is extended. Preferably, the gain of amplifier A1 is one half, so that the limit point for amplifier A1 is the same as that for amplifiers A2 and A3. In this case, $(R1//R2)/R3 = 2R4/(R6-R4)$.

I claim:

1. Differential amplifier apparatus for receiving a differential input signal at first and second input terminals, said differential amplifier apparatus comprising:
   summing and inverting means for developing at an output thereof a signal of which the magnitude is proportional to a common mode component of the input signal and of which the polarity is opposite the polarity of the common mode component,
   a summing network connected to the first and second input terminals and to the output of the summing and inverting means and having first and second intermediate nodes,
   a first amplifier having an input connected to the first intermediate node of the summing network and also having an output,
   a second amplifier having an input connected to the second intermediate node of the summing network and also having an output,
   a differential amplifier having an inverting input to which the output of the first amplifier is connected, a non-inverting input to which the output of the second amplifier is connected, and an output, and
   integrating means connected between the output of the differential amplifier and one of the inputs thereof.

2. Apparatus according to claim 1, wherein the summing and inverting means are connected to the first and second input terminals.

3. Apparatus according to claim 1, wherein the integrating means comprise an inverting amplifier having an input connected to the output of the differential amplifier and an output connected to the non-inverting input of the differential amplifier, and a capacitor connected between the input and output of the inverting amplifier.

4. Differential amplifier apparatus for receiving a differential input signal applied by cable having first and second core conductors and a shield, said apparatus comprising:
   inverter means having an input terminal and an output terminal,
   a resistor connected between the shield of the cable and the input terminal of the inverter,
   a summing network connected to the first and second core conductors and to the output of the inverter means and having first and second intermediate nodes,
   a first amplifier having an input connected to the first intermediate node of the summing network and also having an output, and
   a second amplifier having an input connected to the second intermediate node of the summing network and also having an output.

5. Apparatus according to claim 4, wherein the first amplifier is a differential amplifier whose non-inverting input is connected to the first intermediate node of the summing network and the second amplifier is a differential amplifier whose non-inverting input is connected to the second intermediate node of the summing network.

6. Apparatus according to claim 5, wherein the first and second amplifiers each have an inverting input and the apparatus comprises a bridging resistor connected between the inverting inputs of the first and second amplifiers.

7. Apparatus according to claim 4, wherein the summing network comprises a first resistive divider connected between the first core conductor and the output of the inverter means and having the first intermediate node intermediate its ends and a second resistive divider connected between the second core conductor and the output of the inverter means and having the second intermediate node intermediate its ends.

8. Apparatus according to claim 7, wherein the first and second resistive dividers comprise a first pair of equal-valued resistors connected at one end to the first and second core conductors respectively and connected at the opposite end to the inputs of the first and second amplifiers respectively, and a second pair of equal-valued resistors connected at one end to the inputs of the first and second amplifiers respectively and connected at the opposite end to the output of the inverter means.

9. Apparatus according to claim 4, further comprising a differential amplifier having a non-inverting input to which the output of the first amplifier is connected, an inverting output to which the output of the second amplifier is connected, and an output, and integrating means connected between the output of the differential amplifier and one of the inputs thereof.

10. Apparatus according to claim 4, wherein the inverter means and the summing network are such that a signal is developed at said first and second intermediate nodes having a component related to the common mode component of the input signal by a constant of proportionality that is greater than zero and substantially less than unity.

11. Apparatus according to claim 10, wherein said constant of proportionality is about one-half.

12. Apparatus according to claim 10, further comprising a differential amplifier having an inverting input to which the output of the first amplifier is connected, a noninverting input to which the output of the second amplifier is connected, and an output, and integrating means connected between the output of the differential amplifier and one of the inputs thereof.

13. Apparatus according to claim 12, wherein the first amplifier is a differential amplifier whose noninverting input is connected to the first intermediate node of the summing network and the second amplifier is a differential amplifier whose non-inverting input is connected to the second intermediate node of the summing network, and wherein the first and second amplifiers each have an inverting input and the apparatus further comprises a bridging resistor connected between the inverting inputs of the first and second amplifiers.

14. Apparatus according to claim 10, wherein the first amplifier is a differential amplifier whose noninverting input is connected to the first intermediate node of the summing network and the second amplifier is a differential amplifier whose non-inverting input is connected to the second intermediate node of the summing network, and wherein the first and second amplifiers each have an inverting input and the apparatus further comprises a bridging resistor connected between the inverting inputs of the first and second amplifiers.

15. Differential amplifier apparatus for receiving a differential input signal at first and second input terminals, said differential amplifier apparatus comprising:
  summing and inverting means for developing at an output thereof a signal of magnitude proportional to a common mode component of the input signal and of which the polarity is opposite the polarity of said common mode component,
  a summing network connected to the first and second input terminals and to the output of the summing and inverting means and having first and second intermediate nodes at which is developed a signal having a component related to the common mode component of the input signal by a constant of proportionality that is greater than zero and substantially less than unity.
  a first amplifier having an input connected to the first intermediate node of the summing network and also having an output,
  a second amplifier having an input connected to the second intermediate node of the summing network and also having an output, and
  a differential amplifier having a noninverting input connected to the output of one of the first and second amplifiers, an inverting input connected to the output of the other of the first and second amplifier, and an output.

16. Apparatus according to claim 15, wherein said constant of proportionality is about one-half.

17. Apparatus according to claim 15, wherein the summing network comprises a first resistive divider connected between the first input terminal and the output of the summing and inverting means and having the first intermediate node intermediate its ends, and a second resistive divider connected between the second input terminal and the output of the summing and inverting means and having the second intermediate node intermediate its ends, the first and second resistive dividers being such that the potential at the first intermediate node is the means of the potential at the first input terminal and the potential at the output of the summing and inverting means and the potential at the second intermediate node is the mean of the potential at the second input terminal and the potential at the output of the summing and inverting means, and wherein the summing and inverting means comprise an inverting amplifier having a gain of about one-half.

18. Apparatus according to claim 17, wherein the first and second resistive dividers comprise a first pair of equal-valued resistors connected at one end to the first and second input terminals respectively and connected at the opposite end to the inputs of the first and second amplifiers respectively, and a second pair of equal-valued resistors connected at one end to the inputs of the first and second amplifiers respectively and connected at the opposite end to the output of the summing and inverting means.

19. Apparatus according to claim 15, comprising integrating means connected between the output of the differential amplifier and one of the inputs thereof.

20. Apparatus according to claim 15, wherein the first amplifier is a differential amplifier whose noninverting input is connected to the first intermediate node of the summing network and the second amplifier is a differential amplifier whose non-inverting input is connected to the second intermediate node of the summing network, and wherein the first and second amplifiers each have an inverting input and the apparatus further comprises a bridging resistor connected between the inverting inputs of the first and second amplifiers.

21. Apparatus according to claim 20, comprising integrating means connected between the output of the differential amplifier and one of the inputs thereof.

22. Differential amplifier apparatus for receiving a differential input signal at first and second input terminals, said differential amplifier apparatus comprising:
  summing and inverting means having an output at which a signal of magnitude proportional to a common mode component of the input signal and of opposite polarity is developed,
  a summing network connected to the first and second input terminals and to the output of the summing and inverting means and having first and second intermediate nodes,
  first and second differential amplifiers each having first and second inputs, one of which is an inverting input and the other of which is a non-inverting input, the first input of the first differential amplifier and the first input of the second differential amplifier being connected respectively to the first intermediate node of the summing network and the second intermediate node of the summing network, and
  a bridging resistor connected between the second input of the first differential amplifier and the second input of the second differential amplifier.

23. Apparatus according to claim 22, wherein the bridging resistor is connected between the inverting inputs of the first and second differential amplifiers.

24. Apparatus according to claim 23, further comprising a first resistor having one end connected to the inverting input of the first differential amplifier and an opposite end connected to the output of the first differential amplifier, a second resistor having one end connected to the inverting input of the second differential amplifier and an opposite end connected to the output of the second differential amplifier, a third differential amplifier having an inverting input, a noninverting input and an output, a third resistor connected between the output of the first differential amplifier and the non-inverting input of the third differential amplifier, and a fourth resistor connected between the output of the second differential amplifier and the inverting input of the third differential amplifier.

25. Apparatus according to claim 24, comprising integrating means connected between the output of the third differential amplifier and the non-inverting input thereof.

* * * * *

UNITED STATES PATENT AND TRADEMARK OFFICE
CERTIFICATE OF CORRECTION

PATENT NO. : 5,095,282

DATED : March 10, 1992

INVENTOR(S) : Birney D. Dayton

It is certified that error appears in the above-identified patent and that said Letters Patent is hereby corrected as shown below:

Column 3, line 58, "rang" should read --range--.

Column 4, lines 60-61, the formula should be on one line.

Column 8, line 4, "means" should read --mean--.

Signed and Sealed this

Seventh Day of September, 1993

Attest:

BRUCE LEHMAN

Attesting Officer     Commissioner of Patents and Trademarks